United States Patent [19]

Graycar

[11] Patent Number: 4,871,983
[45] Date of Patent: Oct. 3, 1989

[54] ELECTRONICALLY TUNED DIELECTRIC RESONATOR STABILIZED OSCILLATOR

[75] Inventor: Joseph M. Graycar, Redwood City, Calif.

[73] Assignee: Litton Systems, Inc., Beverly Hills, Calif.

[21] Appl. No.: 220,655

[22] Filed: Jul. 6, 1988

[51] Int. Cl.[4] .............................................. H03B 5/18
[52] U.S. Cl. ........................................ 331/96; 331/99; 331/117 D; 331/177 V
[58] Field of Search ................. 331/36 C, 96, 99, 100, 331/107 DP, 107 SL, 117 D, 177 V; 333/235, 247

[56] References Cited

U.S. PATENT DOCUMENTS

| | | | |
|---|---|---|---|
| 4,521,746 | 6/1985 | Hwan et al. | 331/96 |
| 4,683,447 | 7/1987 | Talwar et al. | 331/177 V |
| 4,724,403 | 2/1988 | Takayama | 331/96 |
| 4,728,913 | 3/1988 | Ishikawa et al. | 333/235 |
| 4,733,198 | 3/1988 | Blickstein et al. | 331/96 |

OTHER PUBLICATIONS

"Novel Techniques for Electronic Tuning for Dielectric Resonators", *Proc. 13th European Microwave Conference*, by A. Faar, pp. 791–796, 1983.

*Primary Examiner*—David Mis
*Attorney, Agent, or Firm*—L. David Rish; Gerald L. Cline

[57] ABSTRACT

An electronically tuned dielectric resonator stabilized oscillator has a dielectric resonator that is fine tuned by an electronic method of tuning which includes a varactor coupled to a microstrip. This varactor microstrip transmission line is positioned below the dielectric resonator but above the plane in which a transmission line for the carrier frequency resides. By not placing the fine tuning microstrip line on the same plane as the main oscillator line, spurious oscillation between the fine tuning transmission line and the primary carrier wave resonator frequency line are minimized. Additionally, the fine tuning microstrip line is positioned orthogonal to the pathways along which the main signal transmission lines are coupled.

11 Claims, 4 Drawing Sheets

ELECTRONICALLY TUNED DIELECTRIC RESONATOR STABILIZED OSCILLATOR

BACKGROUND OF THE INVENTION

1. Field of the Invention

This invention relates to High Frequency Microwave Oscillators, and in particular, to a MIC (Microwave Integrated Circuit) Dielectric Resonator Stabilized Oscillator (DRSO) which is electronically tuned by an inductively coupled Varactor Diode via Microstrip, resident on a plane other than the substrate layer supporting the oscillator microstrip circuit.

2. Description of the Related Art

Microwave oscillators form an important part of all microwave systems such as those used in RADAR, communication links, navigation and electronic warfare. With rapid advancement in technology there has been increasing need for better performance oscillators. The current emphasis is on low noise, small size, low cost, high efficiency, high temperature stability and reliability. Conventional low-frequency resonance circuits consisting of the usual coil and capacitor are not practical at microwave frequencies, because the required values of capacitance and inductance are extremely small. For this and other reasons, it is necessary to select a different form of resonant circuit in the microwave frequency range.

Early in the history of microwave application, it was discovered that in order for a component to resonate at higher frequencies, a hollow closed metal box of nearly any size or shape could be made to resonate in the same manner as a conventional LC circuit at lower frequencies. One advantage in using microwave frequencies is that the higher the frequency, the smaller the component dimensions.

Dielectric resonators provide temperature stable, high Q resonant elements suitable for microwave integrated circuit (MIC) applications. A microwave oscillator using a barium tetratitanate ceramic material ($Ba_2 Ti_4 O_9$) resonator which is integrated into the feedback circuit of a transistor has important advantages. Dielectric resonators provide a significantly simpler oscillator than any alternative microwave generator giving comparable stability at a much lower noise and size. The dielectric resonator typically has a dielectric constant of between 38-40.

In addition to dielectric resonators, microwave stabilized oscillators use planar circuits to designate conductor networks. These planar circuits are deposited over one or both faces of an insulating plate, such as the dielectric substrate. The dielectric resonator and the planar circuits are both key components for the production of microwave integrated circuits (MIC).

One example of a prior art construction of an electronically tuned dielectric resonator stabilized oscillator (DRSO) is shown in FIG. 1. The entire oscillator system 10 is enclosed within a metal conductive material container which is not shown. Along the bottom surface of the container an alumina ($Al_2 O_3$) substrate 12 is provided, which isolates the dielectric resonator 16 from direct contact with the metal box that contains the oscillator system 10. Mounted above the alumina substrate 12 is a fused silica ($Si O_2$) spacer 14, upon which is mounted the dielectric resonator 16. Typically, the dielectric resonator 16 is made from barium tetratitanate ($Ba_2 Ti_4 O_9$).

Etched along the upper surface of the alumina substrate 12 and immediately below the fused silica spacer 14 are microstrips 18 and 24. Microstrip 18 is associated with and coupled to the gate of a common source FET transistor 20. The output signal is derived at the drain of the FET transistor 22. The microstrip 24 is coupled to a varactor diode 26 and is independently powered by the electronic tuning voltage source 28. A rather broadband noise signal of high frequency is provided to the microstrip 18 and is selectively tuned by the dielectric resonator 16 through magnetic field coupling. Frequencies of such microstrip and dielectric resonator circuits may center at a selected resonant frequency in a range anywhere from 1 to 35 gigahertz (GHz). The geometric configuration of dielectric resonator 16, and its associated dielectric constant, provide selection for a resonant frequency for this oscillator system. The magnetic field of microstrip 24 of the varactor diode 26 circuit also may be coupled to the magnetic field of the dielectric resonator 16 in order to electronically tune the signal selected by the dielectric resonator 16 for transmission along the microstrip line 18 to the output FET transistor 20. In this prior art configuration, it will be noted that both the microstrip line 24 and 18 are etched on the same alumina substrate 12.

Another example of a prior art tunable microwave oscillator is U.S. Pat. No. 4,724,403, issued to A. Takayama, assigned to Alps Electric Co. of Japan. In this patent, there is disclosed a microwave oscillator 10 having a metal cover 5. The resonant frequency housing 7 encloses a dielectric resonator 4, while an adjustable screw 6 is used to mechanically tune the oscillator. Other examples of such mechanically tuned dielectric resonator microwave oscillators include U.S. Pat. No. 4,728,913 to Y. Ishikawa (assigned to Murata Mfg. Co. of Japan) and U.S. Pat. No. 4,521,746 issued to E. J. Hwan, et. al. (assigned to Harris Corp. of Melbourne, Fla.). In both these patents, elaborate mechanical tuning is used to increase the range of tuning performance of a dielectric resonator that is housed within a conductive enclosure. Mechanical tuners, while provided a wide range of tuning do not necessarily provide the fine tuning that is necessary for certain microwave applications, such as the use of a microwave oscillator as a local oscillator in a microwave radar receiver system. Fine tuning requires electronic tuning.

Problems have arisen with the prior art construction shown in FIG. 1. By etching both the microstrips lines 18 and 24 on the same alumina substrate, the varactor diode 26 and its associated microstrip 24 have the effect of increased loading of D.R. quality factor thus increasing the close-in noise of the oscillator system.

In the prior art, attempts to improve on the design shown in FIG. 1 have been made in U.S. Pat. No. 4,683,447, to Ashok K. Talwar, et. al., on a patent issued July 28, 1987. In this design, disclosed in the '447 patent, the varactor diode 22 (FIG. 3 of the '447 patent), is electrically connected in a loop 24 with an RF bypass capacitor and is imbedded within a dielectric resonator (36 and 38) which is made from a first and second dielectric substrate and face each other along the plane of the loop 24. As in Prior Art FIG. 1, this patent teaches the placement of the electrically conductive loop 24 along the upper surface 54 of the substrate 56, in the same plane as the microstrip transmission line 10 associated with the oscillator system and its output transistor 8.

The article, NOVEL TECHNIQUES FOR ELECTRONIC TUNING FOR DIELECTRIC RESONATORS, by A. N. Faar, et al.; *Proc. 13th European Microwave Conference,* (Germany) pp. 791–796, (1983), presents an alternative design for varactor tuning of a dielectric resonator as shown in FIG. 7 on page 796. Here, the authors employ a method of voltage control varactor tuning, where the varactor circuit is located above the resonator in order to control the resonator field. The authors show a circular microstrip associated with the varactor diode tuning circuit mounted on top of a quartz spacer, which resides above the dielectric resonator. The dielectric resonator itself is mounted directly on the same substrate as an oscillator microstrip line. This article claims a demonstrated tuning range of 0.75%.

This publication also teaches that an alternative acceptable configuration would be to position the varactor circuit and associated bias line adjacent to the microstrip feed line for the dielectric resonator oscillator on a common substrate. By recommending such a design, the authors overlook the problems inherent when both the oscillator microstrip and tuning microstrip lines are coupled on the same substrate to the dielectric resonator. Furthermore, by having the dielectric resonator reside directly on the alumina substrate, a considerable loss of resonant Q occurs.

The current family of oscillator (feedback) topology, as shown in the Talwar patent and Prior Art FIG. 1, illustrates the inherent difficulty due to physical circuit layout to implement the varactor diode tuning circuitry on the same MIC substrate.

One of the major concerns with the operation of any dielectric resonator stabilized oscillator system (DRSO) is the characteristic FM noise close to the resonant frequency (less than 100 (khz)). In order to optimize FM noise characteristics the dielectric resonator is placed in a location away from the microstrip coupling lines 18 and 24 and the substrate 12 ground plate. In FIG. 1 with the varactor coupling circuit 14 etched on the same substrate as oscillator coupling circuit 18, the adjustment of oscillator resonator loaded Q and electronic tuning sensitivity are mutually affected. As the spacer thickness is increased to improve the resonator loaded Q, the electronic tuning sensitivity is decreased, requiring a new substrate printed circuit geometry to gain back the lost sensitivity. This may take many iterations before the desired results are achieved.

Also, the prior art configuration requires flexibility in the orientation in the varactor coupling circuit with respect to the main oscillator printed circuitry. This is the case since the varactor coupling circuit and the resonator oscillator coupling line lie in the same plane. Such constraints limit size reduction capability and package of versatility. Thus, in the prior art FIG. 1, consideration of the coupling effects of both the microstrip line 18 associated with the main oscillator circuit and the microstrip line 24 associated with the varactor diode 26 must both be taken into account. This continual adjustment for purposes of oscillator system optimization makes the manufacturing process of the desired MIC oscillator hybrid circuit costly and difficult.

SUMMARY OF THE INVENTION

What is needed is an improved electronically tuned dielectric resonator stabilized oscillator which allows independent setting of the optimum parameters associated with both the main oscillator resonator coupling circuit and the varactor diode and associated microstrip circuitry. To this end, a dielectric resonator stabilized oscillator is provided which comprises a resonator means for selecting a particular band frequency. Also included with the stabilized oscillator is a first transmission line substantially disposed in a first plane, the first transmission line being capable of carrying a high frequency input signal and coupled to the resonator. A second transmission line is substantially disposed in a second plane and spaced apart from the first plane. This second transmission line is positioned below and coupled to the resonator. Associated with the second transmission line is a means for fine tuning coupled to this line. Additionally, this invention provides first and second transmission line which are oriented and spaced apart by a distance sufficient to minimize spurious coupling between the first tuning means and the first transmission line.

The dielectric resonator stabilized oscillator of this invention also includes oscillator and tuning microstrip planar circuit lines which may be used as the first and second transmission lines herein described. The tuning microstrip line associated with the fine tuning needs may be substantially orthogonal to the main oscillator microstrip line to minimum spurious interference between the electronic tuning circuit and the main oscillator setting. The fine tuning means provided may be a varactor diode.

A method of manufacturing a dielectric stabilized oscillator comprises the steps of etching at least one oscillator microstrip line on to the upper surface of a semiconductor substrate layer; mounting a fused silica spacer onto the substrate layer; etching a clean microstrip line onto said fused silica spacer; and mounting a dielectric resonator on the fused silica spacer, placing the dielectric resonator at a spaced apart distance from the oscillator and tuning microstrip lines. In this manner, the dielectric resonator means may be coupled to the oscillator microstrip independent of the tuning microstrip line.

These and other advantages and limitations of the invention will become more clear in the Brief Description of the Drawings and Detailed Description of Preferred Embodiment presented hereinafter.

DETAILED DESCRIPTION OF THE PREFERRED EMBODIMENT

Figure 2:
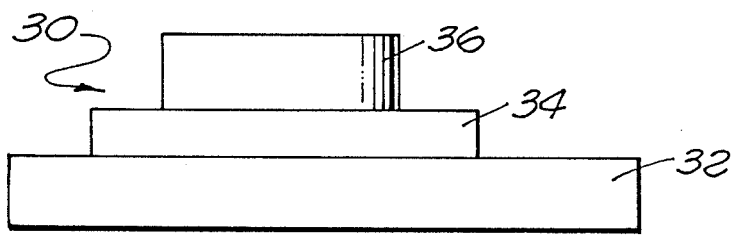
FIG. 2 shows a side view of the electronically tuned dielectric resonator stabilized oscillator of this invention.
Figure 3:
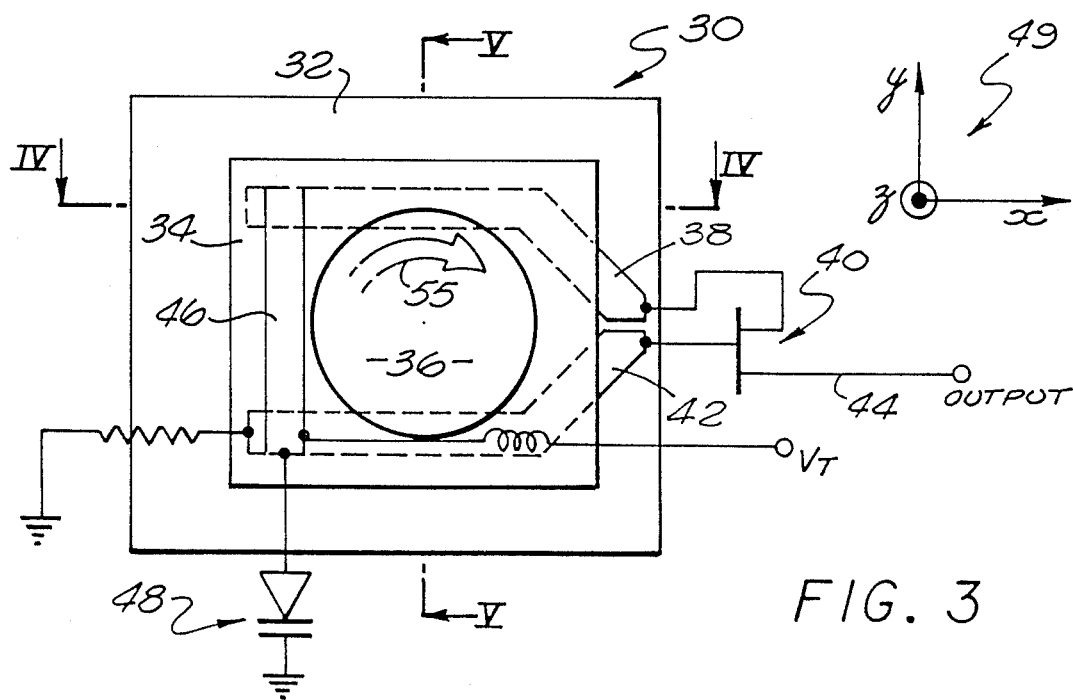
FIG. 3 shows a top plan and schematic view of a preferred embodiment of the electrically tuned dielectric resonator oscillator system of this invention.
Figure 8:
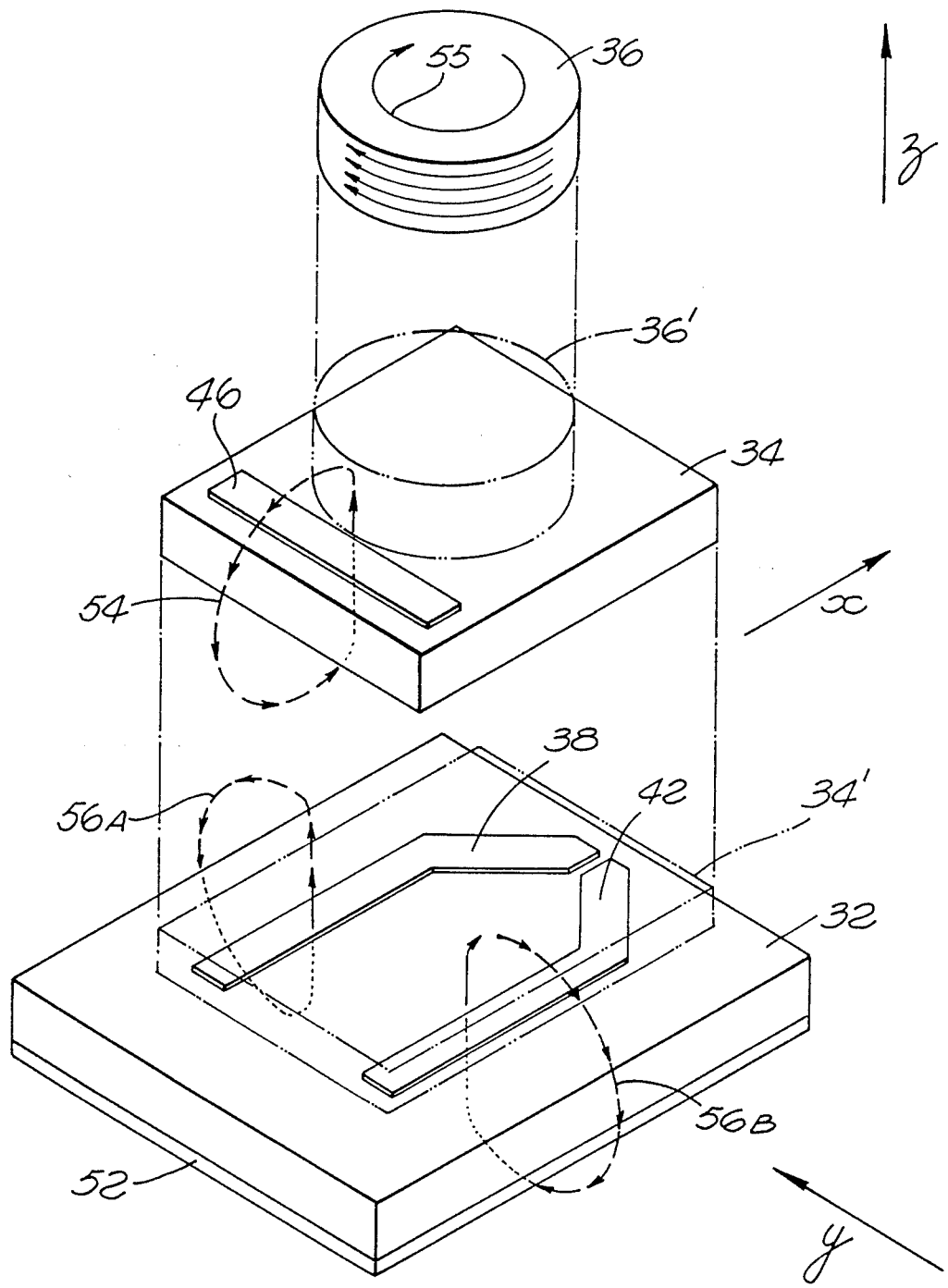
FIG. 8 shows an exploded perspective view of the preferred embodiment shown in FIG. 3 showing the assembly positioning of components included within said embodiment.

With reference to FIGS. 2, 3, and 8, an electronically tuned dielectric resonator stabilized oscillator is shown generally at 30. This oscillator system is comprised of an alumina substrate ($Al_2O_3$) 15 32, a fused silica ($SiO_2$) spacer 34 and a dielectric resonator 36. In this preferred embodiment shown in FIGS. 2, 3 and 8, the alumina substrate 32 is mounted on top of a conductive plate 52 (or the bottom of a metal conductive enclosure box which is conventional and not shown). Mounted on top of the alumina substrate 32 is the fused silica spacer 34, which acts to isolate the alumina substrate 32 from the dielectric resonator 36. In the preferred embodiment, the dielectric resonator 36 may be made from barium tetratitanate ($Ba_2Ti_4O_4$). Other suitable high dielectric constant (range of 20 to 90) materials may be used in place of the barium tetratitanate, so long as these materials exhibit high temperature stability over a wide range and a high dielectric constant. These materials include, but are not limited to, $Zr Ti O_4$, $Sn Ti O_4$, $Ba O_3$, Zr Titanate, Sn Titanate and $Ba Nd_2 Ti O_{14}$. Spatial axes X-Y-Z 49 are shown alongside in FIG. 3. The dielectric resonator 36 is positioned at 36' (when assembled) on top of the fused silica spacer 34 (FIG. 8).

Mounted on the upper surface of the alumina substrate 32, but below the lower surface of the fused silica spacer 34, are two oscillator coupled microstrips 38 and 42. The oscillator resonator coupling microstrip line 38 is etched on the upper surface of the alumina substrate 32 and connected in series to the gate of FET transistor 40. The oscillator resonator coupling microstrip line 42 is connected in series with the drain of the FET transistor 40. An output signal is derived from the oscillator in the configuration shown in the preferred embodiment along a line 44 that is connected to the source of the FET transistor 40. As shown in FIGS. 3 and 8, these two oscillator resonator coupling microstrip lines 38 and 42 are substantially parallel to one another along their entire length and are spaced apart laterally from opposing sides from the dielectric resonator 36. The fused silica spacer 34 is positioned upon this upper surface of the alumina substrate 32 at 34' at final assembly (See FIG. 8).

Figure 1:
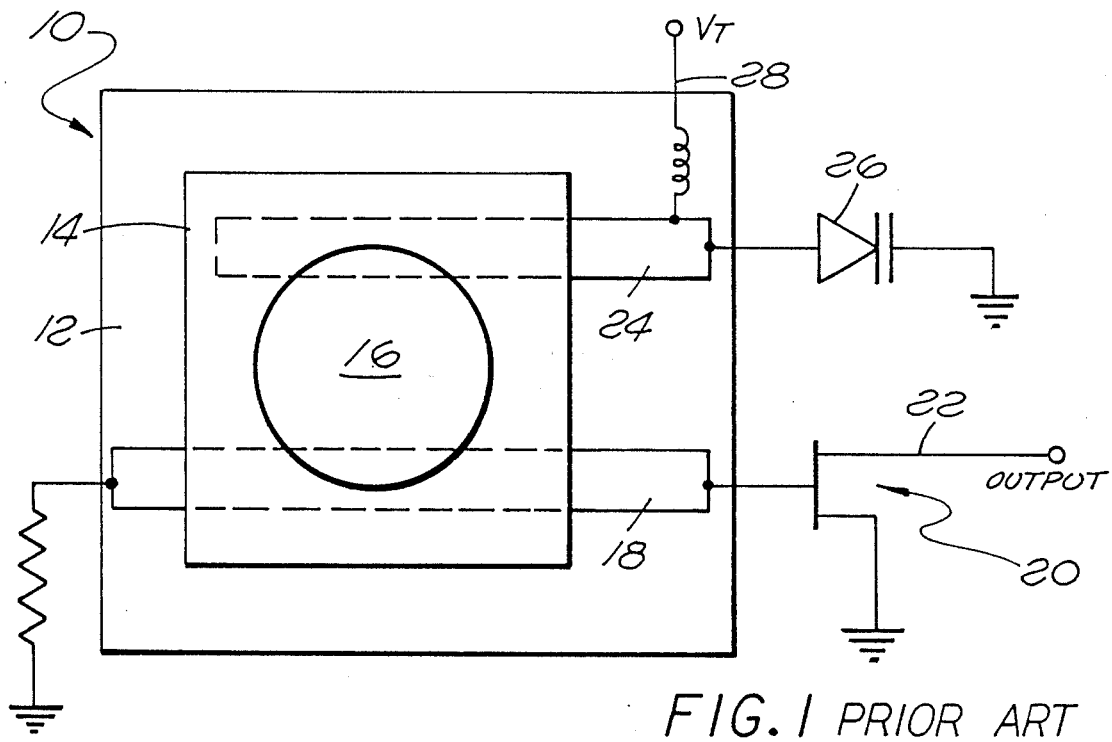
FIG. 1 is a Prior Art schematic drawing showing a plan view of a dielectric resonator oscillator circuit system.

Mounted orthogonal to each of the oscillator resonator coupling microstrip lines 42 and 38 is the fine tuning microstrip line 46. This microstrip line 46 is etched on and mounted on the fused silica spacer 34. It will be noted that this tuning microstrip line 46 spaced below the dielectric resonator 36. The varactor diode microstrip 46 is positioned between the dielectric resonator 36 and the oscillator resonator coupling microstrip lines 42 and 38. Unlike the prior art shown in FIG. 1 and discussed in the FARR article, supra, the varactor microstrip line 46 lies neither in the same plane as the oscillator resonator coupling microstrip lines 42 and 38, nor does the microstrip line 46 lie in a plane positioned above the resonator 36. It will be noted that the magnetic field 56A and 56B arising from each of the microstrip lines 38 and 42 is substantially orthogonal to the orientation of the magnetic field 54 arising along the varactor microstrip line 46 (See FIGS. 4, 5 and 8).

It is this novel manner of positioning the microstrip line 46 that is associated with the varactor tuner 48 that is a distinct improvement over configurations for dielectric resonator stabilized oscillator presented in the prior art. The varactor coupled microstrip line 46 is etched independently into the upper surface of the silica surface 34 after the dielectric resonator 36 has already been tuned and coupled to the microstrip lines 42 and 38 needed to provide a selected high frequency output signal. By positioning the microstrip line 46 orthogonal to both oscillator resonator coupling microstrip lines 42 and 38, one is able to maximize the quality of the resonant frequency obtained by the dielectric resonator 36, without the unnecessary introduction of spurious oscillations into the main coupling network created between the dielectric resonator and each of its associated oscillator resonator coupling microstrip lines 38 and 42. By placing the varactor coupled microstrip line 46 below the resonator 36 but on top of a silica spacer 34, the dielectric resonator is able to maintain its optimized resonant Q since it is spaced apart from the alumina substrate which holds the oscillator resonator coupling microstrip lines 42 and 38.

Figure 4:
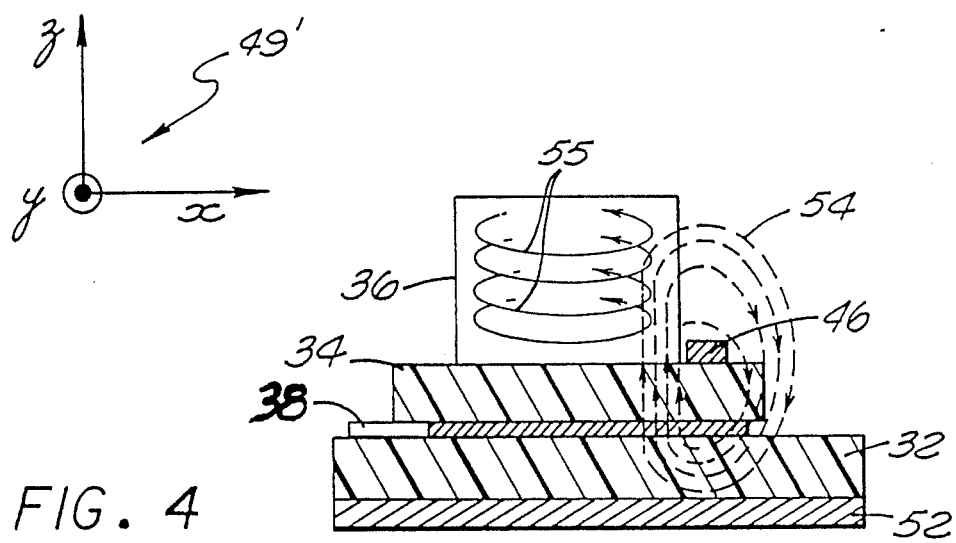
FIG. 4 shows a cross-sectional view taken along line IV—IV of FIG. 3.
Figure 5:
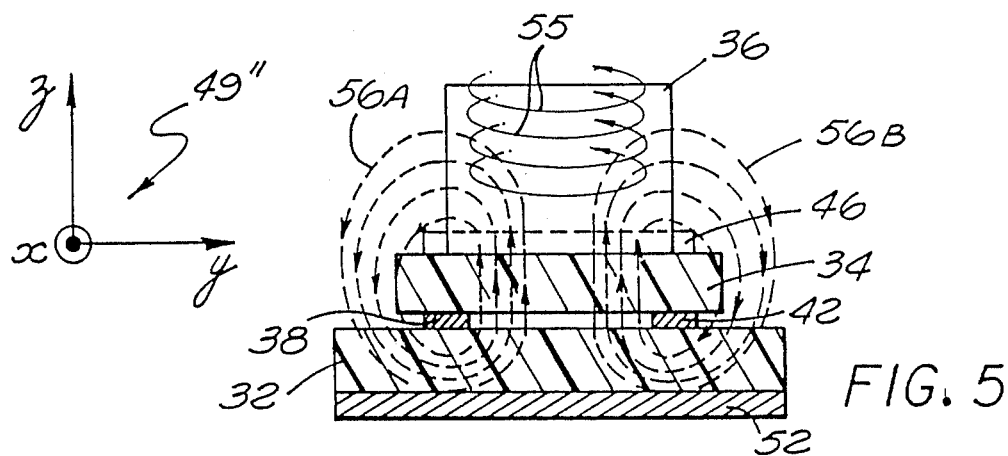
FIG. 5 shows a cross-sectional view taken along line V—V of FIG. 3.

With reference to FIGS. 4 and 5, cross-sectional orthogonal views taken along line IV—IV and V—V of FIG. 3 shows a schematic view of the magnetic field lines and how they interact with one another. The spatial axes are shown at 49' and 49". The dielectric resonator 36, when coupled to microstrip line 42, provides a magnetic field characterized by two lobes 56A and 56B. (FIG. 5 and FIG. 8). These magnetic field lines all project upward and radially from the center of the dielectric resonator 36 to couple with the microstrip lines 38 and 42 as shown in FIG. 5. A circular electric field 55 (see FIGS. 3 and 8) is associated with the magnetic fields 56A & 56B. The varactor diode microstrip projects a magnetic field 54 associated with the microstrip 46 and the metallized conductor (FIG. 4). Since the magnetic field 54 (see FIG. 4) associated with the varactor diode microstrip 46 is orthogonal to the field that results from coupling between the microstrip 42 and the dielectric resonator 36, the varactor diode microstrip 46 is able to electronically tune and modify the magnetic field 56 of the main oscillator circuit without spurious oscillations arising as a result of the magnetic field surrounding the varactor microstrip 46. Rather, a minimal interference is provided by the microstrip 46 and its associated magnetic field 54.

It can thereby be seen by illustration of FIG. 4, that the amount of spurious and unwanted oscillations is minimized so that varactor tuning may be accomplished through use of the microstrip 46 and its associated magnetic field 54. This magnetic field 54, which is used to inductively couple the varactor tuning circuit, does so with minimal radial interference between this field 54 and fields 56A and 56B, especially since the associated microstrip lines 38 and 42 are established orthogonal to the microstrip line 46.

Figure 6:
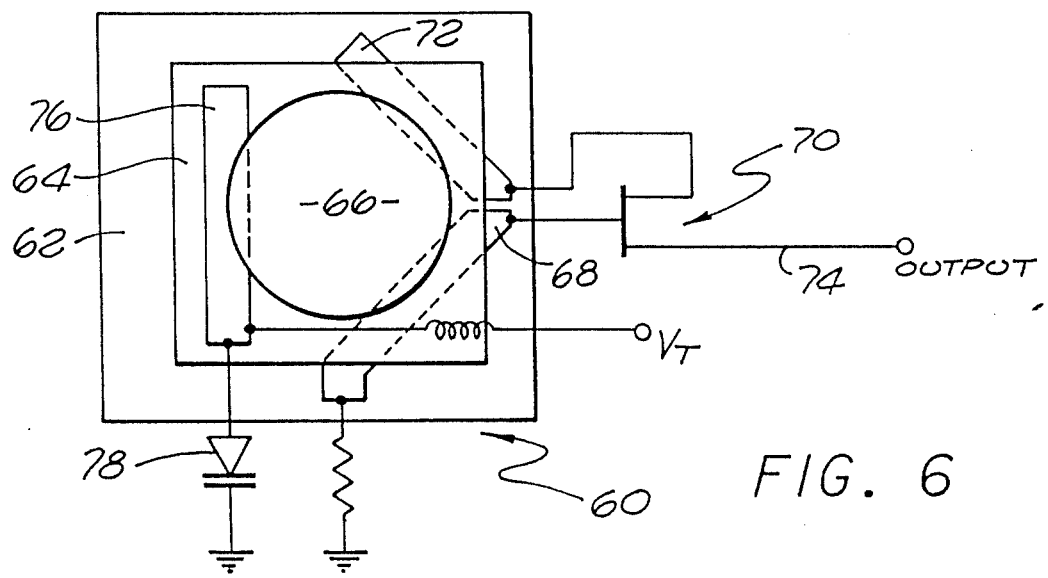
FIG. 6 shows a top plan and schematic view of an alternative embodiment of the electrically tuned dielectric resonator stabilized oscillator of this invention.

Turning now to FIG. 6, there is shown an alternative embodiment of the electrically tuned dielectric resonator stabilized oscillator 60 of this invention. FIG. 6 shows a feedback FET transistor 70 configured in series at its gate and drain to respectively microstrips 68 and 72. These microstrips 72 and 68 are in a V-shaped formation and etched upon the alumina substrate 62 of this alternative embodiment. As in FIG. 3, the FET transistor 70 is a MESFET transistor (metal semiconductor field effect transistor) or another form of galliun arsenide transistor. The varactor diode coupling line 76 is mounted on a spacing fused silica spacer 64 and etched on the upper surface of the silica spacer 64 in a substantially obtuse angle with respect to each of the microstrips 72 and 68, to minimize spurious oscillations from the varactor microstrip 76 coupling to either of the microstrip lines 68 and 72 associated with the oscillator resonator circuit. The microstrip line 76 is coupled in series to the varactor diode 78. An output signal is derived at output 74 connected to the source of the FET transistor 70. This alternative embodiment of the dielectric resonator stabilized oscillator 60 of FIG. 5 also may be distinguished from the prior art in that the varactor diode 78 associated microstrip 76 is positioned in a plane below the dielectric resonator 66 and above each of the planes of the oscillator resonator coupling lines 72 and 68, in order to maximize the selectively and Q of the dielectric resonator 66.

Figure 7A:
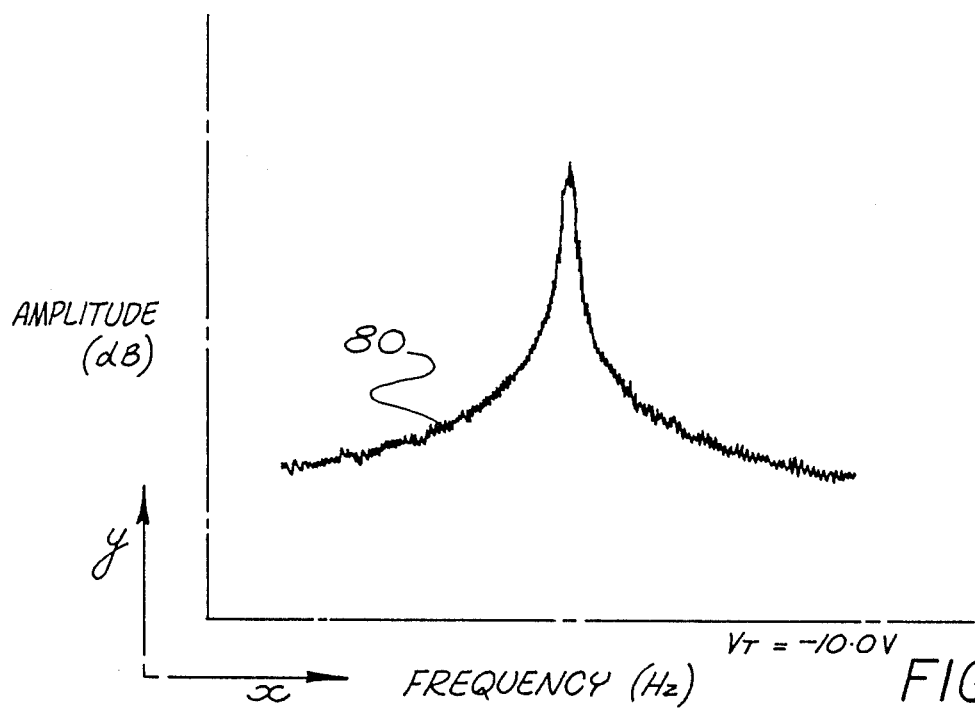
FIGS. 7A and 7B show graphic representation of test results, as pictured on an oscilloscope display, of an operative electrically tuned dielectric resonator stabilized oscillator made in accordance with the teachings of this invention.
Figure 7B:
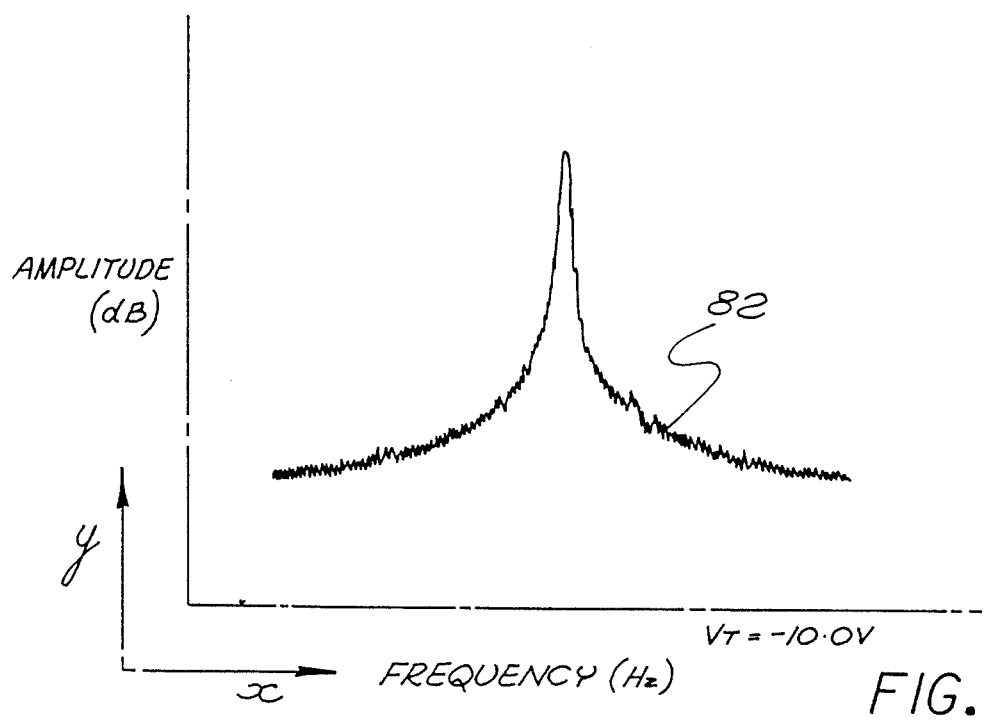

FIGS. 7A and 7B show high Q signals 80 and 82. These signals are characterized by a sharp peak resonant frequency curve. The FM noise exhibited after two runs (shown in FIG. 7A and 7B) is in the range of −94 to −95 dBc per Hertz (Hz) at a 30 KHz spacing from the fundamental frequency. FIGS. 7A and 7B show experimental evidence that highly selective frequency waveforms are achieved by the disclosed system.

While a preferred embodiment and alternative embodiments of the electronically tuned dielectric resonator stabilized oscillator have been disclosed, other equivalent alternative embodiments are intended to be covered within the scope of the appended claims.

What is claimed is:

1. A dielectric resonator stabilized oscillator, comprising:
   resonator means for selecting a particular band frequency;
   a first transmission line substantially disposed in a first plane, said first transmission line capable of carrying a high frequency input signal and coupled to said resonator;
   a second transmission line substantially disposed in a second plane and spaced apart from said first plane, said second transmission line spaced apart from and coupled to said resonator means; and,
   electronic means for fine tuning said resonator, said electronic means for fine tuning coupled to said second transmission line.

2. The device of claim 1 wherein:
   said first and second transmission lines are spaced apart by a distance sufficient to minimize spurious coupling between said electronic fine tuning means and said first transmission line.

3. The device of claim 2 wherein said first and second transmission lines are positioned orthogonal to one another.

4. The device of claim 1, wherein said first transmission line is split into at least two segments,
   a first segment connected to a microwave frequency generator first terminal;
   and, a second segment connected to a microwave frequency generator second terminal;
   said first and second segments connected to an active oscillation means;
   whereby, a feedback signal drives said high frequency input for coupling to said resonator means.

5. A dielectric resonator stabilized oscillator, comprising:
   resonator means for selecting a particular band frequency; a first transmission line substantially disposed in a first plane, said first transmission line capable of carrying a high frequency input signal and coupled to said resonator;
   a second transmission line substantially disposed in a second plane and spaced apart from said first plane, said second transmission line spaced apart from and coupled to said resonator means;
   means for fine tuning said second transmission line; and
   said means for fine tuning said resonator being a varactor diode connected to said second transmission line.

6. A dielectric resonator stabilized oscillator, comprising:
   resonator means lying in a coupling plane for selecting a particular band frequency;
   an oscillator microstrip line capable of carrying a high-frequency input signal selectable by said resonator means, said resonator means coupled along said coupling plane to said microstrip line;
   means for electronically fine tuning said resonator means; said fine tuning means coupled to a tuning microstrip line, said tuning microstrip line being positioned in a second plane spaced apart from said resonator means and parallel to said coupling plane; between said resonator means and said oscillator microstrip line;
   whereby, said resonator means may be fine tuned independent from any resonant coupling between said oscillator microstrip line and said resonator without the introduction of noise or spurious oscillations.

7. The dielectric stabilized oscillator of claim 6, wherein:
   said tuning microstrip line is substantially orthogonal to said oscillator microstrip line.

8. A dielectric resonator stabilized oscillator, comprising:
   resonator means lying in a coupling plane for selecting a particular band frequency;
   an oscillator microstrip line capable of carrying a high-frequency input signal selectable by said resonator means, said resonator means coupled along said coupling plane to said microstrip line;
   means for electronically fine tuning said resonator means; said fine tuning means coupled to a tuning microstrip line, said tuning microstrip line being positioned in a second plane spaced apart from said resonator means and parallel to said coupling plane;
   the resonator means being a cylindrical dielectric resonator mounted on a fused silica spacer;
   said fused silica spacer being mounted on a metallized substrate layer, said substrate layer lying in said coupling plane;
   said oscillator microstrip line being etched onto said substrate and said tuning microstrip line is etched onto said spacer;
   whereby, said resonator means and said oscillator microstrip line may be calibrated independent of said fine tuning means; and said resonator means may be fine tuned independent from any resonant coupling between said oscillator microstrip line and said resonator without the introduction of noise or spurious oscillations.

9. The dielectric resonator stabilized oscillator of claim 8, wherein:
said fine tuning means is a varactor diode.

10. A method of manufacturing a dielectric resonator stabilized oscillator, comprising the steps of:
etching at least one oscillator microstrip line onto a first surface of a substrate semiconductor layer;
mounting a fused silica spacer onto said first surface of said substrate layer;
etching a tuning microstrip line onto said fused silica spacer;
mounting a resonator means on said fused silica spacer, placing said resonator means at a spaced apart distance from said oscillator and tuning microstrip lines;
whereby, the resonator means may be coupled to said oscillator microstrip line independent of said tuning microstrip line.

11. The method of manufacture of claim 10, wherein:
said tuning microstrip line is etched onto said fused silica spacer orthogonal to said oscillator microstrip line.

* * * * *